United States Patent
Kamath et al.

(10) Patent No.: US 8,567,483 B2
(45) Date of Patent: Oct. 29, 2013

(54) HEATSINK WITH FLEXIBLE BASE AND HEIGHT-ADJUSTED COOLING FINS

(75) Inventors: Vinod Kamath, Raleigh, NC (US);
Jason A. Matteson, Raleigh, NC (US);
Aparna Vallury, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 1027 days.

(21) Appl. No.: 12/613,938

(22) Filed: Nov. 6, 2009

(65) Prior Publication Data

US 2011/0108237 A1    May 12, 2011

(51) Int. Cl.
*F28F 7/00* (2006.01)
*F28D 15/00* (2006.01)
*H05K 7/20* (2006.01)

(52) U.S. Cl.
USPC ............... 165/80.3; 165/104.21; 165/104.33; 361/697; 361/700

(58) Field of Classification Search
USPC ..................... 165/80.3, 104.33; 361/697, 700
See application file for complete search history.

(56) References Cited

U.S. PATENT DOCUMENTS

| | | | |
|---|---|---|---|
| 4,823,869 A | 4/1989 | Arnold et al. | |
| 4,849,856 A | 7/1989 | Funari et al. | |
| 4,970,579 A | 11/1990 | Arldt et al. | |
| 5,172,755 A | 12/1992 | Samarov | |
| 5,280,409 A | 1/1994 | Selna et al. | |
| 5,735,340 A | 4/1998 | Mira et al. | |
| 6,035,513 A | 3/2000 | Batten, Jr. et al. | |
| 6,053,240 A | 4/2000 | Johnston et al. | |
| 6,097,601 A | 8/2000 | Lee | |
| 6,308,772 B1 | 10/2001 | Obara et al. | |
| 6,327,886 B1 * | 12/2001 | Eriksson | 72/256 |
| 6,373,701 B1 | 4/2002 | Lo | |
| 6,490,162 B2 | 12/2002 | Siu | |
| 6,549,411 B1 | 4/2003 | Herbert | |
| 6,832,410 B2 * | 12/2004 | Hegde | 165/80.3 |
| 6,950,310 B2 | 9/2005 | Edwards | |
| 7,042,727 B2 | 5/2006 | Ulen et al. | |
| 7,102,226 B2 | 9/2006 | Fitzgerald et al. | |
| 7,280,360 B2 | 10/2007 | Malone et al. | |
| 7,443,678 B2 * | 10/2008 | Han et al. | 361/704 |
| 7,518,872 B2 | 4/2009 | Tran et al. | |
| 7,742,306 B2 * | 6/2010 | Shuai et al. | 361/710 |
| 2003/0131973 A1 | 7/2003 | Nair et al. | |
| 2004/0000393 A1 * | 1/2004 | Tavassoli | 165/80.3 |
| 2004/0149423 A1 | 8/2004 | Johnson et al. | |
| 2005/0063159 A1 | 3/2005 | Ma | |
| 2005/0068741 A1 | 3/2005 | Bailey et al. | |
| 2005/0121172 A1 | 6/2005 | Lopantinsky | |
| 2005/0150633 A1 | 7/2005 | Lee et al. | |

(Continued)

*Primary Examiner* — Allen Flanigan
*Assistant Examiner* — Jason Thompson
(74) *Attorney, Agent, or Firm* — Cynthia G. Seal; Jeffrey L. Streets

(57) ABSTRACT

One embodiment provides a heatsink having a flexible base and height-adjusted cooling fins. The flexible base includes a single base plate, with cooling fins and heat pipes secured directly to an upper surface of the single base plate. The use of the single base plate allows the length of the cooling fins to be increased. The use of a single base plate also allows the base to flex when mounted at the outer region of the base plate to a circuit board using fasteners. The flexure of the base biases the heatsink against the heat-generating component. The flexure also displaces the outer cooling fins, and the length of the outer cooling fins is further increased to compensate for the anticipate displacement.

16 Claims, 3 Drawing Sheets

(56) References Cited

U.S. PATENT DOCUMENTS

| | | | |
|---|---|---|---|
| 2005/0199371 A1* | 9/2005 | Kemink et al. | 165/80.3 |
| 2006/0059684 A1* | 3/2006 | Lee et al. | 29/890.054 |
| 2006/0169437 A1 | 8/2006 | Yano et al. | |
| 2006/0245165 A1 | 11/2006 | Lin | |
| 2007/0029068 A1 | 2/2007 | Cheng et al. | |
| 2007/0215335 A1 | 9/2007 | Chen et al. | |
| 2007/0227696 A1 | 10/2007 | Lin et al. | |
| 2007/0277959 A1 | 12/2007 | Shan | |
| 2007/0279872 A1 | 12/2007 | Lai et al. | |
| 2008/0011451 A1* | 1/2008 | Wang et al. | 165/80.3 |
| 2008/0055855 A1 | 3/2008 | Kamath | |
| 2008/0073070 A1 | 3/2008 | Kuo | |
| 2008/0110594 A1* | 5/2008 | Martin et al. | 165/80.4 |
| 2008/0158816 A1* | 7/2008 | Hung | 361/697 |
| 2008/0197483 A1* | 8/2008 | Ouyang | 257/720 |
| 2008/0218975 A1 | 9/2008 | Mitsui et al. | |

* cited by examiner

HEATSINK WITH FLEXIBLE BASE AND HEIGHT-ADJUSTED COOLING FINS

BACKGROUND OF THE INVENTION

1. Field of the Invention

The present invention relates to heatsinks for cooling electronic components.

2. Background of the Related Art

Electronic components generate heat as a product of consuming electrical power. An example of a heat-generating electronic component in a computer system is a processor, such as a central processing unit (CPU), which executes software instructions from computer programs. A CPU generates a considerable amount of heat as a result of performing numerous high-speed operations required to execute the software instructions. The computer industry is continually innovating cooling systems specific to the unique and demanding cooling requirements of CPUs.

A heat sink is a type of cooling system component that is commonly used to cool a CPU. A heat sink conducts heat away from a CPU, and has cooling fins that provide surface area for airflow to remove the heat by convection. A variety of heat sink designs are known in the art, some of which incorporate a vapor chamber to improve cooling. A vapor chamber is typically a sealed vessel containing working fluid that vaporizes in the vicinity of the hot component. The vaporized working fluid condenses on a cooler surface of the vapor chamber and returns to the vicinity of the hot component. This vaporization and condensation cycle improves heat transfer from the hot component to the heat sink. A heat pipe may be regarded as a specific type of vapor chamber in the form of a sealed pipe or tube.

BRIEF SUMMARY OF THE INVENTION

One embodiment provides a heatsink assembly that includes a heatsink base having a single base plate. The base plate includes oppositely-facing upper and lower surfaces, a rigid inner region for direct thermal contact with a heat-generating component, and a flexible outer region extending outwardly of the rigid inner region. A plurality of heat sink cooling fins are secured directly to the base plate. The plurality of heat sink cooling fins include one or more inner cooling fins traversing the rigid inner region of the base plate and outer cooling fins outwardly spaced from the rigid inner region of the base plate. A plurality of fasteners are provided for securing the base plate to a circuit board at the outer region of the base plate, with the fasteners in sufficient tension to flex the outer region of the base plate while the rigid inner region remains flat against the heat-generating component.

A second embodiment provides a method of manufacturing a heatsink assembly. According to the method, a single base plate is formed having opposing upper and lower surfaces, a rigid inner region, and a flexible outer region about the rigid inner region. A plurality of heat pipes are secured directly to the upper surface of the single base plate. A plurality of cooling fins are formed and secured directly to the upper surface of the base plate.

A third embodiment provides a method of cooling a heat-generating component. According to the method, a heatsink having a single base plate is positioned parallel to a circuit board with a rigid inner region of the base plate in contact with a heat-generating component on the circuit board and with a flexible outer region of the base plate cantilevered about the heat-generating component. The base plate is secured to the circuit board using a plurality of fasteners along the cantilevered outer region of the base plate. The fasteners are tensioned to flex the cantilevered, outer region of the base plate toward the circuit board while the rigid inner region remains flat against the heat-generating component. Airflow through the cooling fins is generated.

DETAILED DESCRIPTION OF THE INVENTION

A first embodiment of the present invention includes a heatsink having a flexible heatsink base and height-adjusted cooling fins. The heatsink base includes a single base plate, rather than two spaced-apart base plates. The use of a single base plate gives the base a desired amount of flexibility, to bias the heatsink against a heat-generating component when secured to a circuit board. The use of a single base plate also allows the length and corresponding surface area of the cooling fins to be increased, for improved cooling. The single base plate includes a rigid inner region, which may lie flat against the flat surface of a processor or other heat-generating component. The base plate also includes a flexible outer region that extends about the rigid inner region. A plurality of threaded fasteners engages the flexible, outer region of the circuit board to secure the base to the circuit board. When the fasteners are tightened, the flexible outer region of the base plate flexes a predetermined amount, which vertically displaces one or more of the outer cooling fins. The height of cooling fins secured to the flexible outer region of the base plate may be further increased (i.e., made taller) relative to the cooling fins secured to the rigid inner region of the base plate, such as by an amount equal to their anticipated downward vertical displacement (i.e., toward the circuit board), so that the mounted heatsink fits within predefined space constraints despite the increased height of the outer cooling fins. The outer cooling fins may also be splayed as a result of the flexed base plate, to open up air channels between the cooling fins. Other embodiments of the invention include a method of manufacturing a heatsink having a flexible base and height-adjusted cooling fins, and a method of cooling a heat-generating component using such as heatsink.

Figure 1:
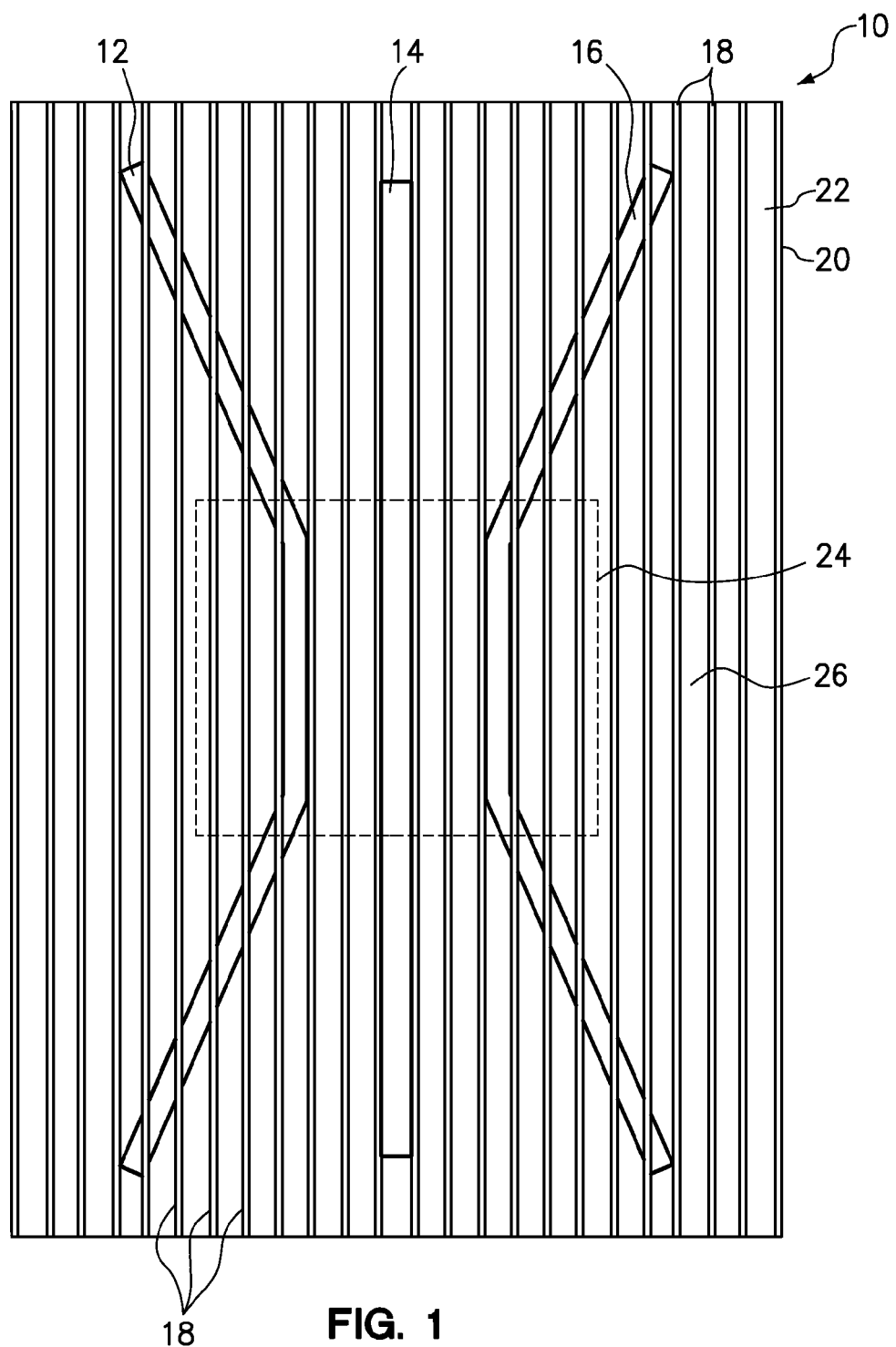
FIG. 1 is a schematic top view of a heatsink according to an embodiment of the invention.

FIG. 1 is a schematic, top view of a heatsink 10 according to an embodiment of the invention. The heatsink 10 includes a heat sink base 20 having a single base plate 22. Three heat pipes 12, 14, 16 and a plurality of cooling fins 18 are attached directly to a top surface of the single base plate 22. The base plate 22 includes a rigid, heat-conducting inner region 24 and a flexible, heat-conducting outer region 26 that is radially outward of the inner region 24. The rigid inner region 24 is intended to make direct thermal contact with a heat-generating component, such as a processor (see discussion of FIGS.

3 and 4), along the underside of the base plate 22. The rigid inner region 24 is therefore rigid enough not to deform appreciably even while the outer region 26 is flexed as described herein, to maintain reliable thermal contact with the heat-generating component. The base plate 22 and cooling fins are made of appropriately heat-conducting materials, such as aluminum, copper, or combinations thereof. For example, the cooling fins may be primarily aluminum, whereas the rigid inner region 24 of the base plate 22 may include a copper slug for added rigidity. Heat generated by the processor or other heat-generating component is transferred by conduction to the base plate 22, and from the base plate 22 to the cooling fins 18. Airflow through the cooling fins 18 removes the heat to ambient air by convection. This transfer of heat from the heat-generating device to ambient air cools the heat-generating component. It should be recognized that the heatsink or components of the heatsink may be made with copper, aluminum, other metals, or various metal alloys or advanced materials. The flexible outer region of the base plate may be made from the same or different material or made with the same or different configuration, such as a reduced thickness or reduced reinforcing.

The three heat pipes 12, 14, 16 are included in this embodiment by way of example, although another embodiment of the invention may include a different number and alternative configuration of heat pipes. As shown in FIG. 1, the three heat pipes 12, 14, 16 includes a straight heat pipe 14 centrally positioned on the base plate 22 and two outer heat pipes 12, 16 on either side of the straight heat pipe 14. The two outer heat pipes 12, 16 have opposing ends that are outwardly bent or curved within a plane that is parallel to the plane of the base plate 22. The heat pipes 12, 14, 16 are sealed vessels containing a working fluid (not shown) that vaporizes in the vicinity of where the inner region 24 of the base plate 22 contacts the heat-generating component, and condenses on a cooler region or surface of the heat pipes 12, 14, 16, to help transfer heat from the heat-generating component, through the base plate 22, and to the cooling fins 18. In another embodiment, the heat pipes do not have to be sealed vessels containing a working fluid.

The combination of the base plate 22 and the heat pipes 12, 14, 16 act as a heat spreader. In particular, the outwardly bent heat pipes 12, 16 help conduct heat from the inner region 24, where the base plate 22 contacts the heat-generating component, and into the outer region 26, for a more even distribution of heat to the cooling fins 18. The dimensions of the heatsink 10, including the dimensions of the inner and outer regions 24, 26, the dimensions of the cooling fins 18, and the dimensions of the heat pipes 12, 14, 16, may vary depending on the particular application, such as a particular computer system configuration with which the heatsink 10 is used. Thus, the illustrated proportions are only one example and should not be construed as limiting.

Figure 2:
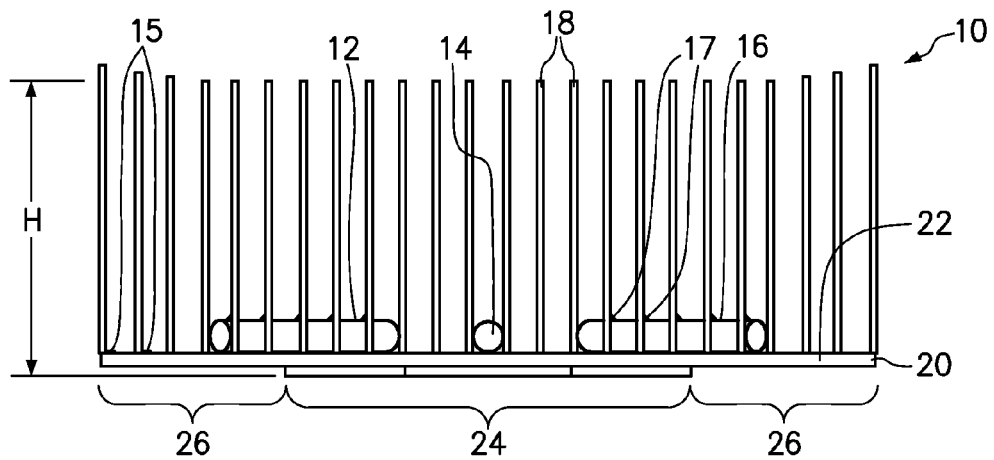
FIG. 2 is a schematic side view of the heat sink of FIG. 1.

FIG. 2 is a schematic side view of the heat sink 10 of FIG. 1. The heat pipes 12, 14, 16 and cooling fins 18 are both mounted directly to the single base plate 22. The cooling fins 18 extend generally orthogonally to the base plate 22 and parallel to one another. However, each cooling fin 18 that intersects with a heat pipe will also include one or more features that extend over the heat pipe(s), while preferably making contact with the heat pipe. Accordingly, the feature is preferably shaped to conform to the shape of the heat pipes 12, 14, 16 prior to joining the cooling fins 18 to the base plate 22. This may be accomplished, for example, by supporting the fins with a fin fixturing tool, and then pressing mandrils having a similar shape and size of the heat pipes into the lower edges of the cooling fins. The cooling fins 18 may then be joined to the base plate 22, such as by brazing at locations 15 where the cooling fins 18 directly contact the base plate 22. A ninety-degree bend is optionally formed along the bottom edge of the cooling fins 18, as indicted by way of example at locations 15, to provide increased surface area for brazing the cooling fins 18 to the base plate 22. The cooling fins 18 may also be brazed or otherwise joined to the heat pipes at locations 17 where certain cooling fins 18 directly contact the heat pipes 12, 14, 16.

In this embodiment, the heat sink base 20 has only one base plate 22 and that one base plate is disposed below the heat pipes and fins. Securing the heat pipes and the fins to the same side of the heat sink base 20 complicates the heat sink fin construction and attachment, but provides a number of structural and functional features that, in combination with other features discussed herein, improve the performance of the heatsink 10. For example, by securing the cooling fins 18 and heat pipes 12, 14, 16 directly to the same side of the single base plate 22, the installed height of the cooling fins 18 may be increased, as compared to a heat sink having first and second base plates on opposing sides of a heat pipe, without increasing the overall height of the heatsink 10 when installed. In one example, the base plate 22 may have a thickness of between 0.5 and 1.0 mm. Avoiding the use of a second base plate might increase the fin height by at least the thickness that would have been occupied by a second base plate (e.g., 0.5 to 1.0 mm). Because the cooling fins 18 may extend all the way down to the single base plate 22 at some locations, the fin height may be further increased at those locations by an amount equal to the height of the heat pipes 12, 14, 16, which may be about 3.0 to 3.5 mm. Increasing the height of the cooling fins 18 increases the surface area of the cooling fins 18, which increases the amount of cooling provided by the heatsink 10. Thus, greater cooling fin surface area is provided within a given amount of space. Accommodating an increase in the fin height without increasing the overall heatsink height is particularly useful in applications with stringent space constraints, such as in a compact, high-density blade server enclosure.

The inner region 24 of the base plate 22 is sufficiently rigid not to be appreciably deformed, even while the outer region 26 is flexed as described herein. The inner region may be reinforced, for example, such as by making the inner region 24 thicker than the outer region 26. Alternatively, the inner region 24 may be reinforced by including a thicker copper slug, whereas the outer region 26 may be formed of a thinner copper or aluminum plate. The heat pipes 12, 14, 16 may also provide some reinforcement to the heatsink base 20. As a result, the outer region 26 is flexible, while the inner region 24 is comparatively stiff. This allows the outer region 26 of the base plate 22 to flex downwardly when secured to a circuit board, as further described below. Some of the cooling fins 18 traverse the inner region 24 of the base plate 22. Other cooling fins 18 spaced further outward extend along only the outer region 26 of the base plate 22, without traversing the inner region 24 of the base plate 22.

Figure 3:
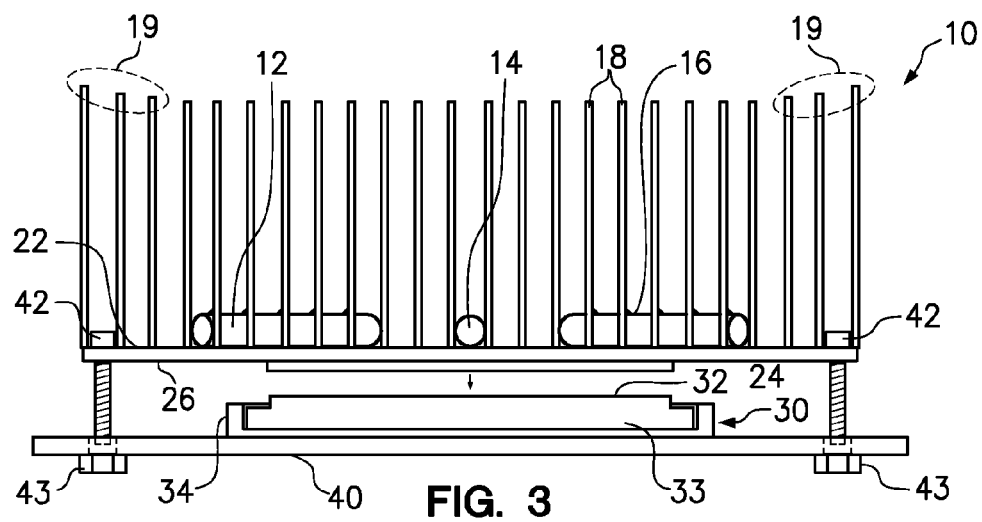
FIG. 3 is a schematic side view of the heatsink of FIG. 1 being lowered into position on a circuit board with a rigid inner region of a base plate aligned with a processor.

FIG. 3 is a schematic side view of the heatsink 10 of FIG. 1 being lowered into position on a circuit board 40 with the rigid inner region 24 of the base plate 22 aligned with a processor 32. The processor 32 serves as the heat-generating component in this embodiment, although a heatsink according to another embodiment of the invention may be used to cool one or more other heat-generating components. The processor 32 in this embodiment is a CPU 32 mounted on a substrate 33 as part of a CPU package 30 that is removably positioned in a socket 34 on the circuit board 40. Prior to securing the heat sink 10 to the circuit board 40, the CPU package 30 has been inserted into the socket 34 loosely. The CPU package may be inserted into the socket 34 with very little (essentially zero) insertion force. The substrate 33 has a plurality of electrical contacts (not shown), as generally understood in the art, that are matched to mating electrical contacts in the socket 34. With the CPU 32 loosely inserted, the CPU 32 may be unseated so that the electrical contacts are not yet fully engaged. The heat sink 10 may be secured to the circuit board 40 using externally and internally threaded fasteners 42, 43. The threaded fasteners may be, for example, bolts (externally threaded fasteners 42) and nuts (internally threaded fasteners 43). Alternatively, the internally threaded fasteners 43 may be threaded sleeves countersunk within the circuit board 40. Securing the heatsink 10 to the circuit board 40 will seat the CPU package 30 to establish electrical communication between the CPU 32 and the circuit board 40, and retain the CPU package 30 in the socket 34. Simultaneously, the fasteners secure the heatsink base in contact with the face of the CPU 32.

Some of the cooling fins 18 that are located outward of the rigid inner region 24 can be made taller (i.e., extend higher above the base plate 22) than other cooling fins of the same heat sink because of the anticipated downward displacement of the cooling fins in response to securing the base plate 22 to the circuit board 40 with the threaded fasteners 42, 43. The heat pipes 12, 14, 16 may also provide incidental reinforcement of the base plate 22, so the cooling fins 18 located outward of the heat pipes 12, 14, 16 are expected to be downwardly displaced the most in response to securing the heatsink 10 to the circuit board 40. By way of example, the three outermost cooling fins 18 on either side of the heatsink 10 may be made taller than the other cooling fins, as generally indicated at 19. The cooling fins are made taller to further increase the net surface area of the cooling fins 18 and to increase the cooling capacity of the heatsink 10 by a corresponding amount.

Figure 4:
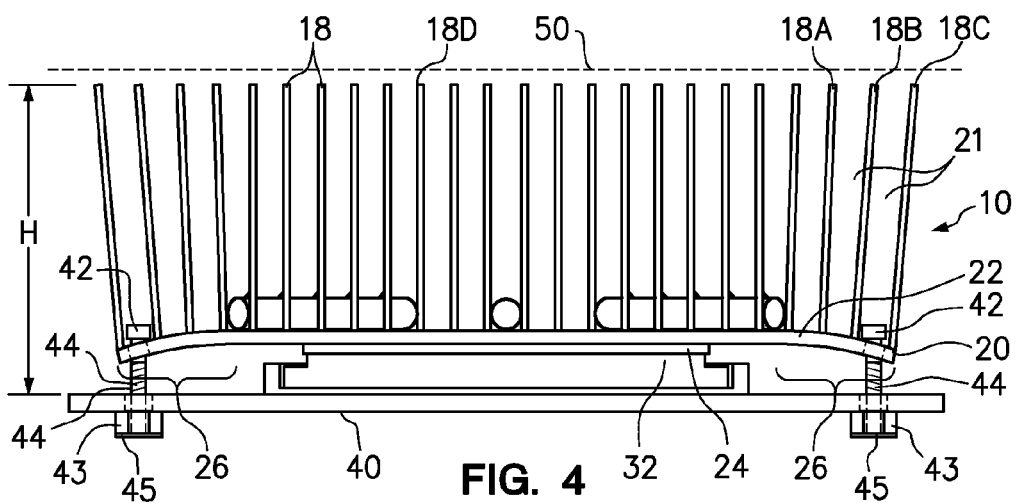
FIG. 4 is a schematic side view of the heatsink of FIG. 3 having been secured to the circuit board using threaded fasteners.

FIG. 4 is a schematic side view of the heatsink 10 of FIG. 3 having been secured to the circuit board 40 using the threaded fasteners 42, 43, with the rigid inner region 24 of the base plate 22 in firm contact with the CPU 32. The threaded fasteners 42 have been threadedly engaged with the complementary threaded fasteners 43 to visibly flex the outer region 26 of the base plate 22. Simultaneously, the rigid inner region 24 resists flexing, to remain flat against the CPU 32, to maximize the heat flux from the CPU 32 to the heatsink 10. Using threaded fasteners to secure a conventional heatsink to a circuit board in a conventional manner would typically require loading the threaded fasteners with coil springs for biasing the heatsink into engagement with a processor. However, the flexible construction of the heatsink base 20 is able to apply a calibrated force between the base plate and the processor without the need for coil springs with the threaded fasteners 42, 43. In particular, the flexibility of the outer region 26 of the base plate 22 provides a biasing action to bias the heatsink 10 against the CPU 32 without the use of coil springs. The elimination of coil springs reduces parts count and associated costs. The flexibility and biasing action of the heatsink base 20 may also be used to accommodate a range of different processor heights as may be used in different applications.

The flexing of the heatsink base 20 as a result of fastening the heatsink 10 to the circuit board 40 displaces the three outer cooling fins 18 on each end, by an amount equal to their extra length as indicated at 19 in FIG. 3. With the heatsink 10 secured to the circuit board 40, all of the cooling fins 18 are substantially aligned within the space constraints defined by a boundary 50. Thus, the installed height H of the heatsink 10 fits within the boundary 50. The boundary 50 may be a physical boundary, such as the wall of a computer chassis, or a defined boundary, such as a limit on the overall height of the heatsink 10. The flexing of the heatsink base 20 as a result of installing the heatsink 10 on the circuit board 40 draws down the taller fins 18A, 18B, and 18C to fit within the boundary 50. Thus, ends of taller, outer cooling fins such as cooling fins 18A, 18B, and 18C are at about the same distance from the circuit board 40 as ends of the shorter cooling fins, such as inner cooling fin 18D.

The outer cooling fins 18A, 18B, 18C may also spread outwardly, i.e. splay, as a result of the flexure of the base 20. The splaying of the outer cooling fins 18A, 18B, 18C slightly increases the spacing between the outer cooling fins 18A, 18B, 18C, to open up air channels 21 between the outer cooling fins 18A, 18B, 18C and further enhance cooling.

The threaded fasteners 42, 43 may have a predefined limit on the amount of threaded engagement that is needed to achieve a predetermined amount of flex of the base plate 22 and a corresponding vertical displacement of the outer cooling fins when the threaded fasteners 42, 43 are fully engaged. For example, to limit the amount of threaded engagement between threaded fasteners 42 and mating threaded fasteners 43, the ends 45 of threaded fasteners 43 may be closed off, to prevent the threaded fasteners 42 from protruding beyond the ends 45 of the threaded fasteners 43. Alternatively, the length of a threaded section 44 of the threaded member 42 and/or the threaded member 43 may be controlled to limit the amount of threaded engagement between the complementary threaded fasteners 42, 43. The threaded engagement between externally and internally threaded fasteners 42, 43 may be limited so that ends of taller, outer cooling fins such as cooling fins 18A, 18B, and 18C are at about the same distance from the circuit board 40 as ends of the shorter cooling fins, such as inner cooling fin 18D.

The outer cooling fins 18A, 18B, 18C may be designed with a fin height that is greater than the height of the other cooling fins by an amount equal to the expected downward displacement of the cooling fins 18A, 18B, 18C in response the predetermined amount of flex of the base plate 22 when the threaded fasteners 42, 43 are fully engaged. In one embodiment, the amount of this downward displacement may be up to 10% of the height of the displaced cooling fins. For example, an inner cooling fin 18D may have a fin height of 20 mm and encounter zero displacement, while an outer cooling fin 18C may have a fin height of 22 mm and be downwardly displaced 2 mm when the threaded fasteners 42, 43 are fully engaged.

Figure 5:
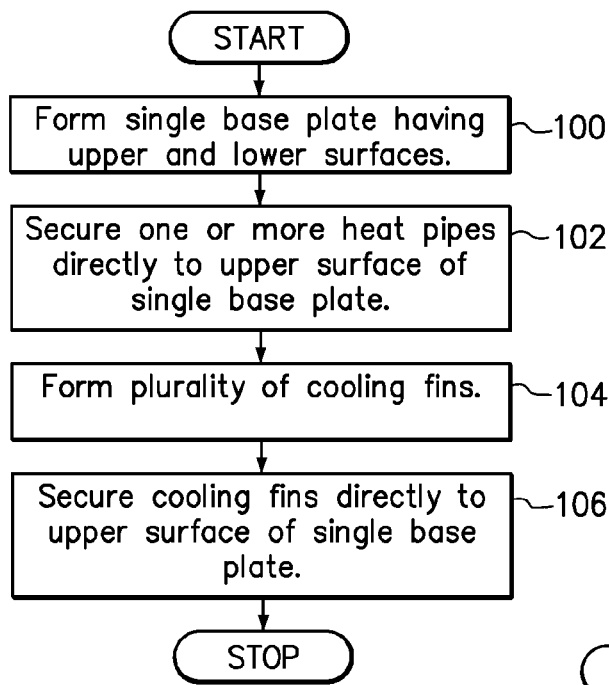
FIG. 5 is a flowchart of a method of manufacturing a heatsink according to an embodiment of the invention.

FIG. 5 is a flowchart of a method of manufacturing a heatsink according to an embodiment of the invention. Step 100 involves forming a single base plate having upper and lower surfaces, a rigid inner region, and a flexible outer region. In step 102, one or more heat pipes are secured directly to the upper surface of the single base plate. The heat pipes may be secured, for example, by brazing or soldering. In step 104, a plurality of cooling fins is formed. Lower edges of the cooling fins may be bent at ninety degrees to increase surface area for brazing or soldering to the upper surface of the base plate. Prior to joining the cooling fins to the base plate, the lower edges of the cooling fins may be further formed to accommodate the heat pipes that are secured to the base plate. For example, the cooling fins may be supported in a fin fixturing tool using the same spacing between fins as will be used in the heatsink. Then, mandrils in the shape of the heat pipes may be pressed into the lower edges to deform the lower edges against the contour of the mandrils. Alternatively, the lower edges of the cooling fins may be pre-cut to conform to the shape of the heat pipes. Subsequently, in step 106, the cooling fins are secured directly to the upper surface of the base plate. The deformed lower edges preferably conform to the heat pipes that were secured to the base plate in step 104. The cooling fins may be secured to the upper surface of the base plate and to the heat pipes by soldering or brazing.

Figure 6:
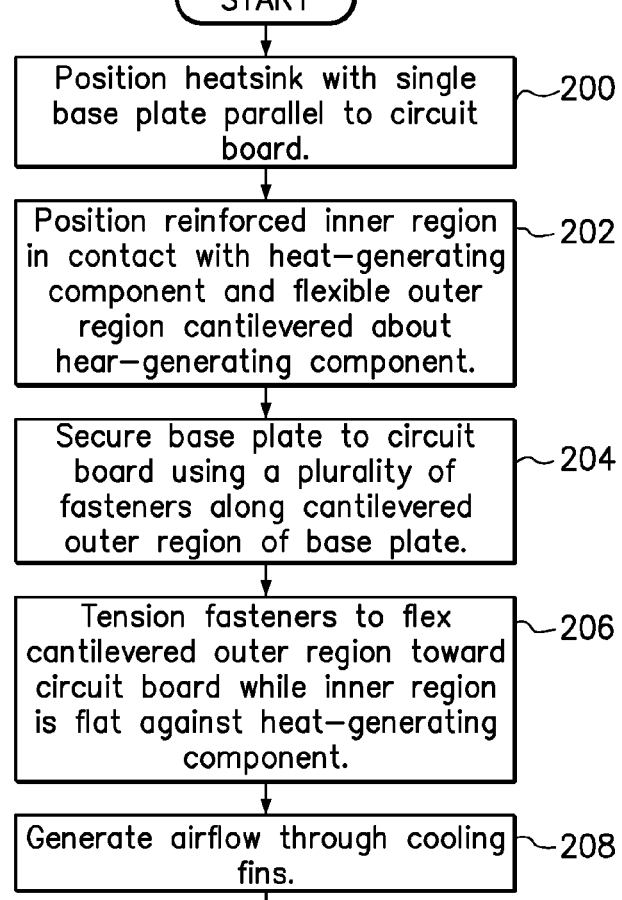
FIG. 6 is a flowchart of a method of cooling a heat-generating component according to an embodiment of the invention.

FIG. 6 is a flowchart of a method of cooling a heat-generating component according to an embodiment of the invention. The heat-generating component may be, for example, a processor on a circuit board. In step 200, a heatsink having base with a single base plate is positioned with the single base plate parallel to the circuit board. In step 202, the base plate is further position with a rigid inner region of the base plate in contact with the heat-generating component. The heatsink is further positioned with a flexible outer region of the base plate cantilevered about the heat-generating component, wherein the rigid inner region is supported against the heat-generating component. In step 204, the base plate is secured to the circuit board using a plurality of fasteners along the cantilevered outer region of the base plate. In step 206, the fasteners (e.g. threaded fasteners) are tensioned to flex the cantilevered outer region of the base plate toward the circuit board while the inner region of the base plate remains flat against the heat-generating component. The fasteners may be tensioned to downwardly displace the taller, outer cooling fins such that ends of the taller, outer cooling fins are at the same distance from the circuit board as the shorter, inner cooling fins. In some cases, the outer cooling fins may be downwardly displaced up to 10% of the fin height. In step 208, airflow is generated through the cooling fins to remove heat from the heatsink. Airflow may be generated by forced convection, such as by using a cooling fan (not shown) to direct airflow at the cooling fins, or by natural convection.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heatsink assembly, comprising:
a heatsink base having a single base plate, the base plate including oppositely-facing upper and lower surfaces, the base plate including a rigid inner region for direct thermal contact with a heat-generating component and a flexible outer region extending outwardly of the rigid inner region;
a plurality of heat sink cooling fins secured directly to the base plate, the plurality of heat sink cooling fins including one or more inner cooling fins traversing the rigid inner region of the base plate and outer cooling fins outwardly spaced from the rigid inner region of the base plate, wherein the outer cooling fins have fin ends located above fin ends of the inner cooling fins when the flexible outer region of the base plate is unflexed; and
a plurality of fasteners for securing the base plate to a circuit board at the outer region of the base plate, wherein the plurality of fasteners may be placed in sufficient tension to flex the outer region of the base plate while the rigid inner region remains flat against the heat-generating component, and wherein the fin ends of the outer cooling fins are not located above fin ends of the inner cooling fins when the flexible outer region of the base plate is flexed.

2. The heatsink assembly of claim 1, wherein the fin ends of the outer cooling fins are substantially planar with the fin ends of the inner cooling fins when the flexible outer region of the base plate is flexed.

3. The heatsink assembly of claim 1, wherein the fin ends of the outer cooling fins are located above the fin ends of the inner cooling fins by an amount of up to 10% of the height of the inner cooling fins when the flexible outer region of the base plate is unflexed.

4. The heatsink assembly of claim 1, wherein the fasteners comprise external and internal threaded fasteners having a limited threaded engagement.

5. The heatsink assembly of claim 4, wherein the threaded engagement between the external and internal threaded fasteners is limited so that ends of all of the cooling fins are at the same distance from the circuit board when the external and internal threaded fasteners are fully engaged.

6. The heatsink assembly of claim 1, wherein the rigid inner region is thicker than the outer region.

7. The heatsink assembly of claim 1, further comprising: one or more heat pipes secured directly to the base plate.

8. The heatsink assembly of claim 7, wherein one or more of the heat pipes is curved within a plane that is parallel to the plane of the base plate.

9. The heatsink assembly of claim 1, wherein the rigid inner region comprises a copper slug.

10. The heatsink assembly of claim 1, wherein the heat-generating component comprises a processor.

11. A method of cooling a heat-generating component, comprising:
positioning a heatsink having a single base plate parallel to a circuit board with a rigid inner region of the base plate in contact with a heat-generating component on the circuit board and with a flexible outer region of the base plate cantilevered about the heat-generating component, wherein a plurality of inner cooling fins extend from the rigid inner region of the base plate and a plurality of outer cooling fins extend from the flexible outer region of the base plate, and wherein the plurality of outer cooling fins have fin ends located above fin ends of the plurality of inner cooling fins when the flexible outer region of the base plate is unflexed;

securing the base plate to the circuit board using a plurality of fasteners along the cantilevered outer region of the base plate;

tensioning the fasteners to flex the cantilevered, outer region of the base plate toward the circuit board while the rigid inner region remains flat against the heat-generating component, wherein the fin ends of the plurality of outer cooling fins are not located above the fin ends of the inner cooling fins when the flexible outer region of the base plate in flexed; and generating airflow through the cooling fins.

12. The method of claim 11, wherein tensioning the fasteners to flex the cantilevered, outer region of the base plate toward the circuit board includes flexing the cantilevered, outer region of the base plate toward the circuit board until the fin ends of the outer cooling fins are substantially planar with the fin ends of the inner cooling fins.

13. The method of claim 11, wherein the fin ends of the plurality of outer cooling fins are located above the fin ends of the inner cooling fins by an amount of up to 10% of the height of the plurality of inner cooling fins when the flexible outer region of the base plate is unflexed.

14. The method of claim 11, wherein the oppositely-facing upper and lower surfaces of the base plate are substantially parallel planar surfaces.

15. The heatsink assembly of claim 8, wherein the plurality of heat sink cooling fins and the one or more heat pipes are secured to the upper face of the base plate.

16. The heatsink assembly of claim 1, wherein the oppositely-facing upper and lower surfaces of the base plate are substantially parallel planar surfaces.

* * * * *